United States Patent [19]

Stoakley et al.

[11] Patent Number: 5,376,209
[45] Date of Patent: Dec. 27, 1994

[54] PROCESS FOR PREPARING AN ASSEMBLY OF AN ARTICLE AND A POLYMIDE WHICH RESISTS DIMENSIONAL CHANGE, DELAMINATION AND DEBONDING WHEN EXPOSED TO CHANGES IN TEMPERATURE

[75] Inventors: Diane M. Stoakley; Anne K. St. Clair, both of Poquoson, Va.

[73] Assignee: The United States of America as represented by the Administrator of the National Aeronautics and Space Administration, Washington, D.C.

[21] Appl. No.: 141,430

[22] Filed: Oct. 20, 1993

Related U.S. Application Data

[63] Continuation of Ser. No. 736,880, Jul. 26, 1991, abandoned.

[51] Int. Cl.$^5$ .............................. C09J 5/00; B05D 1/00
[52] U.S. Cl. .................................. 156/330.9; 427/96; 427/207.1; 427/430.1; 156/60
[58] Field of Search .................... 427/96, 207.1, 430.1; 156/60, 331.6, 330.9

[56] References Cited

U.S. PATENT DOCUMENTS

| | | | |
|---|---|---|---|
| 4,284,461 | 8/1981 | St. Clair | 156/331.5 |
| 4,311,615 | 1/1982 | Taylor | 252/514 |
| 4,576,857 | 3/1986 | Gannett | 427/96 |
| 4,609,565 | 9/1986 | Yates | 427/96 |
| 4,670,325 | 6/1987 | Bakos | 427/96 |
| 4,839,232 | 6/1989 | Morita | 427/96 |
| 4,842,948 | 6/1989 | Gagliani | 427/207.1 |
| 5,112,462 | 5/1992 | Swisher | 427/96 |
| 5,167,985 | 12/1992 | Ito | 427/96 |
| 5,248,519 | 9/1993 | Stoakley | 427/96 |

OTHER PUBLICATIONS

St. Clair et al "Electrically-Conductive Palladium-Containing Polyimide Films" NASA Tech Briefs, Fall, 1980 p. 325.
Kirk-Othemer "Encyclopedia of Chemical Technology" vol. 18 John Wiley & Sons, 1982 pp. 706, 707, 711.

*Primary Examiner*—Shrive Beck
*Assistant Examiner*—Vi Duong Dang
*Attorney, Agent, or Firm*—George F. Helfrich; Joy L. Bryant

[57] ABSTRACT

An assembly of an article and a polyimide composition is prepared. The assembly resists dimensional change, delamination, or debonding when exposed to changes in temperature. An article is provided. A polyamic acid solution which yields a polyimide having a low coefficient of thermal expansion (CTE) was prepared. Equimolar quantities of an aromatic diamine and an aromatic dianhydride were reacted in a solvent medium to form a polyamic acid solution. A metal ion-containing additive was added to the solution. Examples of this additive are: $TbCl_3$, $DyCl_3$, $ErCl_3$, $TmCl_3$, $Al(C_5H_7O_2)_3$, and $Er_2S_3$. The polyamic acid solution was imidized and is combined with the article to form the assembly.

12 Claims, 1 Drawing Sheet

PROCESS FOR PREPARING AN ASSEMBLY OF AN ARTICLE AND A POLYMIDE WHICH RESISTS DIMENSIONAL CHANGE, DELAMINATION AND DEBONDING WHEN EXPOSED TO CHANGES IN TEMPERATURE

ORIGIN OF THE INVENTION

The invention described herein was made by employees of the United States Government and may be manufactured and used by or for the Government for governmental purposes without the payment of any royalties thereon or therefor.

This is a continuation of copending application Ser. No. 07/736,880 filed on Jul. 26, 1991 now abandoned.

CROSS REFERENCE TO RELATED CASES

This application is related to co-pending patent application Ser. No. 07/736,667, filed Jul. 26, 1991, U.S. Pat. No. 5,248,519, entitled "A Process for Preparing an Assembly of an Article and a Soluble Polyimide which resists Dimensional Change, Delamination, and Debonding when Exposed to Changes in Temperature".

BACKGROUND OF THE INVENTION

1. Field of the Invention

This invention relates to polyimides which have a low coefficient of thermal expansion (CTE). More particularly, it relates to the preparation of an assembly of an article and a polyimide which resists dimensional change, delamination and debonding when exposed to changes in temperature.

2. Description of the Related Art

Polyimides have become widely used as high performance polymers as a result of their excellent thermal stability and toughness. However, polymers in general, including polyimides, have higher CTEs than metals, ceramics, and glasses. Lowering the CTE of polyimides would increase their usefulness for aerospace and electronic applications where dimensional stability is a requirement.

The CTEs of polyimides have been lowered in the past by linearizing the polymer molecular structure or by controlling the orientation of the polyimide film. Numata et al. (*Polymer Engineering and Science*, 28, (4), 906 (1988)) lowered the CTE by synthesizing a linear polyimide. By employing polyimides prepared from pyromellitic dianhydride (PMDA) or 3,3',4,4'-biphenyltetracarboxylic dianhydride (s-BPDA) and aromatic diamines that contain only benzene or pyridine rings in para-positions without flexible linkages, they have synthesized polyimides with CTEs from 20–0.4 ppm/°C. Numata and Miwa (*Polymer*, 30, (60), 1170 (1989)) found that the CTEs of uniaxially stretched polyimide films with rigid and flexible molecular chains were lower than their non-oriented counterparts.

By the present invention, an assembly of an article and a polyimide with a low CTE is prepared. The assembly resists dimensional change, delamination, and debonding when exposed to changes in temperature. The CTEs have been reduced by incorporating a metal ion-containing additive into a polyamic acid solution. St. Clair et al. (U.S. Pat. No. 4,284,461), Taylor et al. (U.S. Pat. No. 4,311,615) and Stoakley and St. Clair ("Lanthanide-Containing Polyimides" *Recent Advances in Polyimide Science and Technology*, W. D. Weber and M. R. Gupta, Eds., Society of Plastics Engineers, New York, 1987, pp 471–479) used these additives to alter the adhesive, electrical, and magnetic properties of polyimides.

Accordingly, it is the object of the present invention to prepare an assembly of an article and a polyimide which resists dimensional change, delamination, and debonding when exposed to temperature changes by forming a low CTE polyamic acid solution which is imidized.

Another object of the invention is to reduce the CTE of the polyimide by incorporating a metal ion-containing additive into the polyamic acid solution so it more closely matches the CTE of the article.

Other objects and advantages of the invention will become apparent to those skilled in the art upon consideration of the accompanying disclosure.

SUMMARY OF THE INVENTION

An assembly of an article and a low CTE polyimide film or coating is prepared. The assembly resists dimensional change, delamination or debonding when exposed to changes in temperature. An article is provided. A polyamic acid solution was prepared by reacting equimolar quantities of an aromatic diamine and an aromatic dianhydride in a solvent medium. A metal ion-containing additive was added to the solution. Examples of this additive are: $TbCl_3$, $DyCl_3$, $ErCl_3$, $TmCl_3$, $Al(C_5H_7O_2)_3$, and $Er_2S_3$. The polyamic acid solution was imidized to yield a low CTE metal ion-containing polyimide film, which is then combined with the article to form the assembly.

The article selected for the assembly is: a solar concentrator, antennae, solar cell arrays, second surface mirrors, precision solar reflectors, electronic circuit boards, or any other item known to those skilled in the art. A precision solar reflector is the preferred article for this application.

A polyamic acid solution was prepared at a concentration of 10–15 weight percent. An equimolar quantity of an aromatic diamine was reacted with an aromatic dianhydride in a solvent medium. A metal ion-containing additive was added to the solution at a concentration of 4–30 weight percent. Erbium chloride gave the most effective results for this application.

A thin-film assembly for a solar reflector is prepared. The metal ion-containing polyamic acid solution is, poured onto a glass, metal, or other surface having the shape of the reflector. The resin is spun-cast to a thickness of 0.5 to 5.0 mils and heated to produce a low CTE polyimide film. The film is removed from the surface and combined with a reflecting article and protective topcoat to form the assembly.

An article is either coated with or embedded into the metal ion-containing polyamic acid solution or bonded to the low CTE polyimide substrate. The article is also attached to the polyimide substrate by surface-treatment to form the assembly. In cases where the article is coated with or embedded into the polyamic acid solution, thermal imidization is used to form the polyimide. Thermal imidization was performed by heating the solution to about 100° C.–300° C.

A polyimide substrate is formed either thermally or chemically prior to the attachment of an article. Chemical imidization is performed by reacting the polyamic acid solution with acetic anhydride and pyridine, recovering the precipitate, and heating under pressure to fuse the imide powder. The article is bonded to the polyimide substrate with a polyimide-based adhesive or by surface treatment.

DESCRIPTION OF THE PREFERRED EMBODIMENTS

Figure 1:
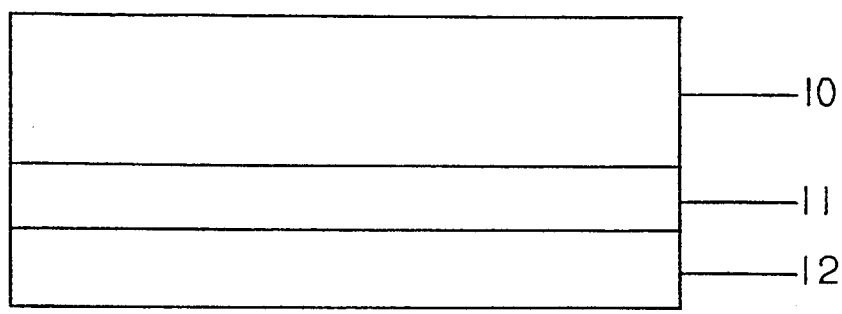
FIG. 1 is a schematic showing a preferred embodiment of the present invention where the low CTE polyimide is used as a substrate.

A solution of a metal ion-containing polyamic acid resin, which yielded a polyimide having a low coefficient of thermal expansion (CTE), was prepared at 10–15% solids. An equimolar quantity of 3,3',4,4'-benzophenone tetracarboxylic dianhydride (BTDA) or 2,2-bis(3,4-dicarboxyphenyl)hexafluoropropane dianhydride (6FDA) was added to a stirred solution of 4,4'-oxydianiline (4,4'-ODA) or 1,3-bis(aminophenoxy)benzene (APB) in a polar organic solvent such as N,N-dimethylacetamide (DMAc). The resulting polyamic acid solution was stirred at room temperature for approximately 2½ hours. A metal ion-containing additive was added at a concentration range of approximately 4–30 weight percent either before the addition of the monomers, immediately following the addition of the dianhydride or after the polyamic acid polymerization was completed.

The metal ion-containing polyamic acid solution was cast as a film on soda-lime glass plates using a doctor blade set to obtain a cured film thickness of approximately 0.025 mm (1 mil). The film was placed in a low humidity box overnight and then imidized by heating in a forced air oven for 1 hour each at 100°, 200°, and 300° C. The film was removed from the glass plate by soaking in water.

Although the dianhydrides, BTDA and 6FDA, and the diamines, 4,4'-ODA and APB, were used in the polyamic acid polymerization, other dianhydrides and diamines employed in the preparation of polyamic acids or polyimides may be used in the present invention.

The solvent medium for the polyamic acid was DMAc. However, other solvents known to those skilled in the art such as: N,N-dimethylformamide, 1-methyl-2-pyrrolidinone, and dimethyl sulfoxide may be used in the preparation of polyamic acids.

The metal ion-containing additives of this invention included the chlorides of the following lanthanides: terbium (TbCl$_3$), dysprosium (DyCl$_3$), erbium (ErCl$_3$), holmium (HoCl$_3$), and thulium (TmCl$_3$). An additional lanthanide-containing additive used was erbium sulfide (Er$_2$S$_3$). One other metal ion-containing additive used was aluminum acetylacetonate (Al(C$_5$H$_7$O$_2$)$_3$). Each additive reduced the CTE and it was found that ErCl$_3$ gave the best results. The data is shown in Tables I and II.

TABLE I

Coefficients of Thermal Expansion of Metal Ion-Containing BTDA/4,4'-ODA Films

| Additive | % Additive | Tg by TMA, °C. | CTE ppm/°C. |
|---|---|---|---|
| BTDA/4,4'-ODA Control | 0.0 | 281 | 39.1 |
| TbCl$_3$ | 11.3 | 297 | 27.4 |
| DyCl$_3$ | 11.4 | 292 | 26.3 |
| ErCl$_3$ | 11.6 | 302 | 17.0 |
| TmCl$_3$ | 11.6 | 314 | 19.5 |
| Er$_2$S$_3$ | 17.1 | 303 | 24.5 |
| Al(C$_5$H$_7$O$_2$)$_3$ | 11.1 | 295 | 27.8 |

TABLE II

Coefficients of Thermal Expansion of Metal Ion-Containing 6FDA/APB Films

| Additive | % Additive | CTE, ppm/°C. |
|---|---|---|
| 6FDA/APB Control | 0.0 | 51.0 |
| TmCl$_3$ | 6.9 | 35.7 |
| HoCl$_3$ | 6.8 | 42.5 |
| Al(C$_5$H$_7$O$_2$)$_3$ | 8.0 | 43.3 |

It was also found that increasing the concentration of the metal ion-containing additive resulted in a decrease in the CTE. Table III gives these results.

TABLE III

Effect of TbCl$_3$ Concentration on Coefficient of Thermal Expansion

| Additive mole Tb$^{+3}$: mole polymer | % Additive | Coefficient of Thermal Expansion ppm/°C. |
|---|---|---|
| BTDA/4,4'-ODA Control | 0.0 | 39.1 |
| 1:10 | 4.5 | 33.3 |
| 1:4 | 11.3 | 27.4 |
| 1:2 | 22.6 | 21.0 |

There were many additional metal ion-containing additives that were found not to be useful for this application. These additives were: holmium acetate, erbium N-phenylphthalamate, erbium acetylacetonate, tin chloride, terbium fluoride, dysprosium fluoride, lutetium fluoride, silver nitrate, gadolinium acetate, holmium sulfide, erbium acetate, cerium acetylacetonate, neodymium acetylacetonate, samarium acetylacetonate, terbium acetylacetonate, praseodymium nitrate, neodymium nitrate, samarium nitrate, holmium nitrate, erbium nitrate, thulium nitrate, ytterbium nitrate, europium chloride, gadolinium sulfide, terbium sulfide, dysprosium sulfide, terbium iodide, thuluim iodide, and dysprosium bromide. Some of these additives caused the polyamic acid solution to gel while others, although they made good films, were not effective in lowering the CTE. It is for this reason that the additives listed in Tables I and II gave unexpected results.

A low CTE polyimide substrate is prepared by pouring the metal ion-containing polyamic acid solution into a mold, drying then imidizing by heating for one hour each at 100°, 200°, and 300° C. Another method of forming the substrate is to slowly add the metal ion-containing polyamic acid solution to a stirred mixture of acetic anhydride and pyridine. The imide precipitate is recovered, washed with water, and dried. The imide powder is poured into a mold and fused by heating under pressure to form the polyimide substrate.

An article is provided to form an assembly with the polyimide. Examples of this article are: a solar concentrator, antennae, solar cell arrays, second surface mirrors, precision solar reflectors, or electronic circuit boards. Other articles known to those skilled in the art can also be used. A metal ion-containing polyamic acid solution was prepared. The solution is used to coat the article, to embed the article, or to form a substrate to which the article is bonded. For example, a circuit board is coated by either spraying, dipping, or brushing with the polyamic acid solution. The solution is imidized by heating for 1 hour each at 100°, 200°, and 300° C. in a forced air oven. The coated article is resistant to delamination when exposed to temperature changes.

In another example, the polyamic acid solution is cast into a mold. The circuit board is embedded into the solution prior to imidizing. After imidizing, the resulting assembly is resistant to debonding.

As another example, an article is attached to a polyimide substrate formed from the polyamic acid solution. The solution is imidized by heating and the article is attached to the substrate with a polyimide-based adhesive. The resulting assembly is resistant to dimensional change, debonding, and delamination when exposed to changes in temperature.

In yet another example, an assembly for a solar reflector is prepared. The metal ion-containing polyamic acid solution is poured onto a glass, metal, or other surface having the shape of the reflector. The resin is spun-cast to a thickness of 0.5 to 5.0 mils and heated to produce a low CTE polyimide film. The film is removed from the surface and combined with a reflecting article and protective topcoat to form the assembly.

EXAMPLES

Example 1

Preparation of the 15% solids polyamic acid solution of BTDA/4,4'-ODA was conducted at room temperature by dissolving 60.07 g (0.30 mole) of 4,4'-ODA in 948 ml DMAc. After the diamine was dissolved, 96.67 g (0.30 mole) BTDA were added and stirred. After three hours, the polyamic acid solution was clear yellow with an inherent viscosity of 1.49 dl/g when measured at 0.5% solids in DMAc at 35° C. A film of this control resin was cast on a glass plate at a 15 mil blade gap and left in a low humidity film box overnight. This tack free film was then cured by heating in a forced air oven for one hour each at 100°, 200°, and 300° C. The resulting film had a glass transition temperature of 281° C. The CTE of this yellow control film was determined to be 39.1 ppm/° C. over the temperature range of 70°–110° C.

To 10.45 g of the 15% solids BTDA/4,4'-ODA stock resin was added 0.199 g (0.00075 moles) TbCl$_3$ in 2 ml DMAc. This mixture was stirred at room temperature for several hours, resulting in a milky white resin. A film of this 1:4 TbCl$_3$:BTDA/4,4'-ODA resin was cast on a glass plate using a 15 mil blade gap. It was placed in a low humidity film box overnight and cured like the control film. The resulting hazy yellow film had a Tg of 297° C. and a CTE of 27.4 ppm/° C.

Example 2

The process of Example 1 was repeated using 0.202 g (0.00075 moles) DyCl$_3$. The resulting 1:4 DyCl$_3$:BTDA/4,4'-ODA film was a hazy amber film with a Tg of 292° C. and a CTE of 26.3 ppm/°C.

Example 3

The process of Example 1 was repeated using 0.205 g (0.00075 moles) ErCl$_3$. The resulting 1:4 ErCl$_3$:BTDA/4,4'-ODA film was a hazy amber film with a Tg of 302° C. and CTE of 17.0 ppm/°C.

Example 4

The process of Example 1 was repeated using 0.206 g (0.00075 moles) TmCl$_3$. The resulting 1:4 TmCl$_3$:BTDA/4,4'-ODA film was a hazy yellow film with a Tg of 314° C. and CTE of 19.5 ppm/°C.

Example 5

The process of Example 1 was repeated using 0.080 g (0.0003 moles) TbCl$_3$. The resulting 1:10 TbCl$_3$:BTDA/4,4'-ODA film was a slightly hazy yellow film with a CTE of 33.3 ppm/°C.

Example 6

The process of Example 1 was repeated using 0.398 g (0.0015 moles) TbCl$_3$. The resulting 1:2 TbCl$_3$:BTDA/4,4'-ODA film was a hazy amber film with a CTE of 21.0 ppm/°C.

Example 7

The process of Example 1 was repeated using 0.195 g (0.0006 moles) Al(C$_5$H$_7$O$_2$)$_3$. The resulting 1:5 Al(C$_5$H$_7$O$_2$)$_3$:BTDA/4,4'-ODA film was a transparent amber film with a coefficient of thermal expansion of 27.8 ppm/°C.

Example 8

To 37.9830 g of DMAc, 0.5010 g (0.00182 moles) TmCl$_3$ were added. The mixture was stirred at room temperature for approximately ½ hour, then 2.6603 g (0.0091 moles) APB were added. Stirring was continued until the diamine was dissolved. After dissolution of the diamine, 4.0830 g (0.009191 moles) 6FDA were added and stirring was continued for approximately 19 hours.

A film of this resin was cast at 18 mils thickness on a glass plate and placed in a low humidity film box overnight. The resin was cured by heating in a forced air oven for one hour each at 100°, 200°, and 300° C. The resulting peach colored 1:5 TbCl$_3$:6FDNAPB film had a CTE of 35.7 ppm/°C. as compared to 51.0 ppm/°C. for the colorless control 6FDA/APB film.

Example 9

Figure 3:
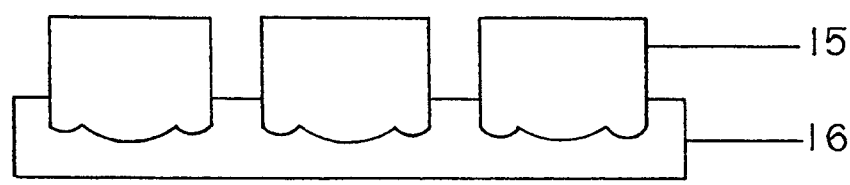
FIG. 3 is a schematic showing the formation of an assembly by embedding an article into the low CTE polyimide.

An article 15 (of FIG. 3) is attached to a low CTE polyimide substrate prepared from the metal ion-containing polyamic acid solution as in Example 1. The solution is poured into a mold and the article is embedded in the solution 16 (of FIG. 3). The assembly is imidized by heating for 1 hour each at 100° C., 200° C., and 300° C. in a forced air oven. The article is resistant to debonding when exposed to changes in temperature.

Example 10

Figure 4:
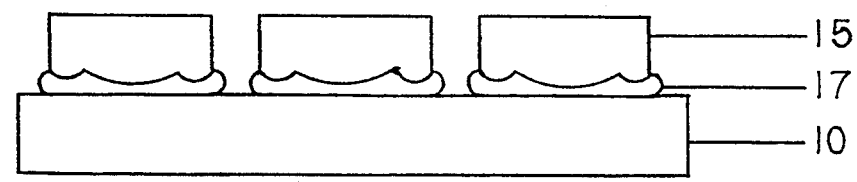
FIG. 4 is a schematic showing an article attached to a low CTE polyimide substrate with an adhesive.

An article 15 (of FIG. 4) is attached to a low CTE polyimide substrate 10 (of FIG. 4) prepared from the metal ion-containing polyamic acid solution as in Example 1. The solution is poured into a mold and is imidized by heating for 1 hour each at 100° C., 200° C., and 300° C. in a forced air oven. The article is attached to the substrate by bonding it with an adhesive 17 (of FIG. 4).

The article is resistant to debonding when exposed to changes in temperature.

Example 11

Figure 2:
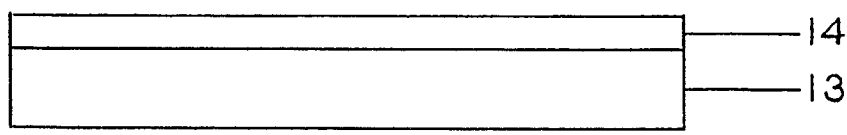
FIG. 2 is a schematic showing an article which is coated with a low CTE polyimide to form an assembly.

A circuit board 13 (of FIG. 2) is coated with a metal ion-containing polyamic acid solution 14 (of FIG. 2) as in Example 1. The coating is applied to the circuit board by spraying, brushing, dipping, or any other method known to those skilled in the art. The coating is imidized by heating for 1 hour each at 100° C., 200° C., and 300° C. in a forced air oven. The coated article 14 (of FIG. 2) is resistant to delamination when exposed to changes in temperature.

Example 12

A thin-film assembly for a solar reflector (FIG. 1) is prepared. A metal ion-containing polyamic acid solution as in Example 1 was prepared. The solution is poured onto a glass, metal, or other surface which has the shape of the reflector. The solution is spun-cast to a thickness of 0.5 to 5.0 mils and heated to 100° to 300° C. in a forced air oven. The resulting substrate 10 (of FIG. 1) is removed from the surface and is metallized with a highly reflecting metal layer 11 (of FIG. 1) such as silver, aluminum, or chromium. The metal layer is applied at a thickness between 10 and 2000 Å using a surface treatment such as vapor deposition or sputtering. A clear protective topcoat 12 (of FIG. 1) is applied at 0.1 to 1.0 mil thickness to prevent tarnishing. The layers of the assembly are resistant to dimensional change, debonding, or delamination upon exposure to changes in temperature.

The above examples are considered to be illustrative of the invention and there may be modifications and variations in the metal ion-containing additive, the polyimide, or the article that will be apparent to those skilled in the art without departing from the spirit and scope of the invention as set forth herein. It is therefore to be understood that the invention may be practiced otherwise than as specifically described and claimed herein.

What is claimed to be new and desired to be secured by Letters Patent of the United States is:

1. A process for preparing an assembly of an article and a metal ion-containing polyimide film having a low coefficient of thermal expansion, whereby the assembly resists dimensional change, delamination, and debonding when exposed to temperature changes, the process comprising:
   a. providing an article;
   b. preparing a metal ion-containing polyamic acid solution by chemically reacting equimolar quantities of an aromatic diamine and an aromatic dianhydride in a solvent medium to which is added a metal ion-containing additive selected from the group consisting of: $TbCl_3$, $DyCl_3$, $ErCl_3$, $Al(C_5H_7O_2)_3$, $HoCl_3$, and $Er_2S_3$;
   c. imidizing the polyamic acid solution to form a metal ion-containing polyimide film having a reduction in the coefficient of thermal expansion ranging from about 6 ppm/°C. to about 18 ppm/°C.; and
   d. attaching the polyimide film of step c to the article with a polyimide-based adhesive to form the assembly.

2. The process of claim 1, wherein said article is selected from the group consisting of: solar concentrators, antennae, solar cell arrays, second surface mirrors, precision solar reflectors, and electronic circuit boards.

3. The process of claim 2, wherein said article is a precision solar reflector.

4. The process of claim 1, wherein the concentration of said polyamic acid solution is about 10–15 weight percent.

5. The process of claim 1, wherein said aromatic diamine is 4,4'-oxydianiline.

6. The process of claim 1, wherein said aromatic dianhydride is 3,3',4,4'-benzophenone tetracarboxylic dianhydride.

7. The process of claim 1, wherein the concentration of said metal ion-containing additive is 4–30 weight percent.

8. The process of claim 1, wherein said metal ion-containing additive is $ErCl_3$.

9. The process of claim 1, wherein said imidizing is performed by heating the metal ion-containing polyamic acid solution from about 100° C. to about 300° C. to form a metal ion-containing polyimide film.

10. The process of claim 1, wherein said imidizing is performed by reacting the metal ion-containing polyamic acid solution with acetic anhydride and pyridine, recovering an imide precipitate, and fusing the recovered imide precipitate by heating under pressure.

11. The process of claim 1, wherein said dianhydride is 2,2-bis(3,4-dicarboxyphenyl)hexafluoropropane dianhydride.

12. The process of claim 1, wherein said aromatic diamine is 1,3-bis(aminophenoxy)benzene.

* * * * *